United States Patent [19]
Dutton et al.

[11] Patent Number: 5,170,098
[45] Date of Patent: Dec. 8, 1992

[54] PLASMA PROCESSING METHOD AND APPARATUS FOR USE IN CARRYING OUT THE SAME

[75] Inventors: Robert W. Dutton, Los Altos Hills, Calif.; Masafumi Kubota, Osaka, Japan

[73] Assignee: Matsushita Electric Industrial Co., Ltd., Osaka, Japan

[21] Appl. No.: 884,615

[22] Filed: May 15, 1992

Related U.S. Application Data

[63] Continuation of Ser. No. 787,695, Nov. 1, 1991, abandoned, which is a continuation of Ser. No. 598,460, Oct. 9, 1990, abandoned.

[30] Foreign Application Priority Data

Oct. 18, 1989 [JP] Japan ................................ 1-270628

[51] Int. Cl.$^5$ ............................................. H05M 1/24
[52] U.S. Cl. ........................... 315/111.21; 315/111.41; 313/231.31
[58] Field of Search ............. 315/111.21, 111.41, 315/111.81; 313/231.31; 250/423 R; 333/32

[56] References Cited

U.S. PATENT DOCUMENTS

| | | | |
|---|---|---|---|
| 3,569,777 | 3/1971 | Beaudry | 315/111.21 |
| 4,810,933 | 3/1989 | Moisan et al. | 315/111.21 X |
| 4,877,999 | 10/1989 | Knapp et al. | 315/111.21 X |
| 4,887,005 | 12/1989 | Rough et al. | 315/111.21 |
| 4,935,661 | 6/1990 | Heinecke et al. | 315/111.21 X |
| 4,956,582 | 9/1990 | Bourassa | 315/111.21 |

OTHER PUBLICATIONS

"In-Situ Monitoring of Electrical Parameters for Dry Etching," *Materials Research Society Symposia Proceedings*, vol. 98, 1987.

*Primary Examiner*—Eugene R. LaRoche
*Assistant Examiner*—Do Hyun Yoo
*Attorney, Agent, or Firm*—Panitch Schwarze Jacobs & Nadel

[57] ABSTRACT

A plasma processing apparatus is provided which includes a plasma reaction chamber in which plasma is generated for processing, an RF power supply for feeding RF power into the plasma reaction chamber through an impedance matching circuit, and a feedback mechanism for maintaining plasma impedance within the plasma reaction chamber substantially constant, the feedback mechanism containing the impedance matching circuit which also functions as impedance sensing means. Also provided is a plasma processing method including the step of etching or depositing films by using plasma, while maintaining plasma impedance substantially constant by applying feedback to at least one selected from the group consisting of gas pressure in the plasma reaction chamber, rate of gas flow into the plasma reaction chamber, magnetic field, microwave power, and RF power.

10 Claims, 9 Drawing Sheets

PLASMA PROCESSING METHOD AND APPARATUS FOR USE IN CARRYING OUT THE SAME

This is a continuation of application Ser. No. 07/787,695 filed Nov. 1, 1991, now abandoned, which is a continuation of application Ser. No. 07/598,460 filed Oct. 9, 1990, now abandoned.

BACKGROUND OF THE INVENTION

1. Field of the Invention

This invention relates to a processing method utilizing chemical or physical reactions caused by plasma at the interface between the gas phase and the solid phase, and it also relates to an apparatus for use in carrying out the method.

2. Description of the Prior Art

The recent amazing progress in the field of microelectronics centered with respect to integrated circuits have been bringing about a great social revolution comparable to the Industrial Revolution, together with such a great advance as seen today in the field of optoelectronics and more especially in the laser technology. Since the integrated circuit was first invented, the degree of integration in integrated circuits has become greater by leaps and bounds, and indeed there have been successively developed large scale ICs (LSIs), very large scale ICs (VLSIs), and ultra large scale ICs (ULSIs). Such high degrees of integration have been achieved through dimensional microminiturization of elements, improvement of device construction and circuits, and so on.

The construction of elements have already reached a level such that further microminiturization can no longer be expected, insofar as the conventional planar (or two-dimensional) structure is concerned. Thus, attention is now directed toward the development of three-dimensional structures, e.g., a structure utilizing trenches formed in a substrate by using a directional-etching technique, and a structure having multi-layer lines formed therein by using a reflow flattening technique. It is anticipated that the degree of integration in integrated circuits will continue to become greater until it reaches the physical possible limit of element structures.

In order to enhance the degree of integration in integrated circuits, it is necessary to reduce the size of elements such as transistors and resistances and the size of the wiring pattern. For a minimized pattern size, a microfine pattern of 1 μm or less is presently being put into practical use, which is comparatively close to the limit of about 0.4 μm when the optical exposure technique is used. According to the optical exposure technique, it is not possible to obtain a pattern finer than the wavelength of light beams. Therefore, in order to obtain a finer pattern, it is necessary to use X rays or electron beams of shorter wavelengths. For the realization of such a fine pattern, the dry etching technique will have an important role in conjunction with the litghography technique.

The dry etching technique is a process for removing unnecessary portions of a film or of a substrate utilizing chemical or physical reactions caused by plasma, radicals, and/or ions at the interface between the gas phase and the solid phase. There are known a number of dry etching techniques, including the gas phase etching technique, plasma etching technique, spatter etching technique, and ion beam etching technique. For the spatter etching and ion beam etching techniques, there are cases in which active ions and/or radicals are used, and in such case the techniques are specifically called the reactive spatter etching technique and the reactive ion beam etching technique, respectively. These techniques can be suitably employed in the process of manufacturing integrated circuits.

The reactive spatter etching technique is also known as the reactive ion etching technique, such that when a sample is exposed to the reactive ions in plasma produced by high frequency discharge of a suitable gas, an etching reaction occurs whereby unnecessary portions of the sample surface are removed. It is noted in this connection that necessary portions are usually protected by a photoresist pattern used as a mask.

FIG. 8 is a schematic diagram showing a reactive ion etching apparatus as an example of conventional dry etching apparatus. As can be seen from the drawing, a reactive gas flow is introduced into a metallic chamber 1 through a gas controller 2, the gas flow being controlled to a proper pressure by an exhaust system 3. An anode 4 is disposed in an upper portion of the chamber 1, and a sample stand 5 which serves as a cathode is disposed in a lower portion of the chamber 1. An RF power supply 7 is connected to the sample stand 5 through an impedance matching circuit 6 so that a high frequency discharge is caused to take place between the sample stand 5 and the anode 4. In such a reactive ion etching apparatus, the reactive ions in the plasma are accelerated in an ion sheath produced by the high frequency discharge to impinge upon the sample 8 (i.e., the material to be etched) so that an etching reaction occurs, which enables a highly directional etching operation, or a so-called anisotropic etching operation, to be carried out.

Proportionately, as the size of an element is reduced, a gate oxide film of for example, a transistor is formed thinner and a diffusion layer is formed shallower. Accordingly, it is required that the dry etching technique be more selective and that the plasma used should be of lower energy. The reason for this is that the charge up of the gate electrode may result in gate oxide breakage, or that impingement of high-energy ions upon the silicon substrate may be a cause of a crystal defect or impurity inclusion. With a view to solving such problems, attention is being directed to the use of an electron cyclotron resonance (ECR) plasma etching technique which utilizes the phenomenon of ECR as a source of plasma generation.

However, the conventional reactive ion etching (RIE) and ECR plasma etching techniques have their disadvantage in respect of process repeatability. This is considered to be due to the fact that since an atmosphere having depositing characteristics is used in order to satisfy high selectivity and anisotropy requirements, the etching characteristics of the technique are greatly affected by deposited films on the inner wall of the chamber. For example, in ECR plasma etching wherein $SF_6$ is used as a principal gas, the rate of etching is found to be dependent on the number of processed pieces, which is taken as one of the main factors responsible for process instability.

In the etching techniques using plasma, it is necessary to apply a negative bias voltage to the sample stand in order to accelerate the positive ion produced in the plasma. For application of a negative bias voltage, two methods are available for use, namely, a fixed bias method which uses an independent DC power supply and a self bias method which utilizes a negative voltage generated by DC-floating the sample stand by means of a capacitor.

In order to attain improved process repeatability, an attempt has been made with respect to the self bias method, such that a negative bias voltage is kept at a predetermined value. For example, in the reactive ion etching technique wherein the ion energy during etching operation corresponds roughly to the DC potential $V_{dc}$ at the sample stand, the RF power is controlled so that $V_{dc}$ can be kept constant.

However, it is known that the condition of plasma is not only dependent on the DC potential $V_{dc}$ at the sample stand, but also on other factors, such as electron density and ion density in the plasma, as well as electron temperature. The above method cannot control the values of these important parameters, therefore it has rarely been used in actual etching operations.

SUMMARY OF THE INVENTION

The plasma processing apparatus of this invention, which overcomes the above-discussed and numerous other disadvantages and deficiencies of the prior art, comprises a plasma reaction chamber in which plasma is generated for processing, an RF power supply for feeding RF power into the plasma reaction chamber through an impedance matching circuit, and a feedback mechanism for maintaining plasma impedance within the plasma reaction chamber substantially constant, the feedback mechanism containing the impedance matching circuit which also functions as the impedance sensing means.

In a preferred embodiment, the imaginary component of the plasma impedance is maintained substantially constant.

In a preferred embodiment, the above-mentioned feedback mechanism contains a feedback parameter setting circuit connected to the impedance matching circuit, wherein the feedback parameter setting circuit sets at least one feedback parameter value on the basis of information concerning the plasma impedance and then feeds back the parameter value, or the above-mentioned feedback mechanism directly applies feedback on the basis of information concerning the plasma impedance.

In a more preferred embodiment, the above-mentioned feedback is applied to at least one selected from the group consisting of gas pressure in the plasma reaction chamber, rate of gas flow into the plasma reaction chamber, magnetic field, microwave power, and RF power.

In a more preferred embodiment, the above-mentioned information concerning the plasma impedance is at least one capacity value of capacitors used in the impedance matching circuit.

The plasma processing method of this invention, which overcomes the above-discussed and numerous other disadvantages and deficiencies of the prior art, comprises the step of etching or depositing films by using plasma, while maintaining plasma impedance substantially constant by applying feedback to at least one selected from the group consisting of gas pressure in the plasma reaction chamber, rate of gas flow into the plasma reaction chamber, magnetic field, microwave power, and RF power.

In a preferred embodiment, the imaginary component of the plasma impedance is maintained substantially constant.

The invention described herein makes possible the objectives of (1) providing a plasma processing method which affords accurate reproduction of the plasma condition independently of deposited films on the inner wall of the chamber; (2) providing a plasma processing method which affords high practical applicability in obtaining highly improved process repeatability and accuracy; and (3) providing an apparatus for use in carrying out the plasma processing method having such excellent advantages.

BRIEF DESCRIPTION OF THE DRAWINGS

This invention may be better understood and its numerous objectives and advantages will become apparent to those skilled in the art by reference to the accompanying drawings as follows.

DESCRIPTION OF THE PREFERRED EMBODIMENTS

EXAMPLE 1

Figure 1:
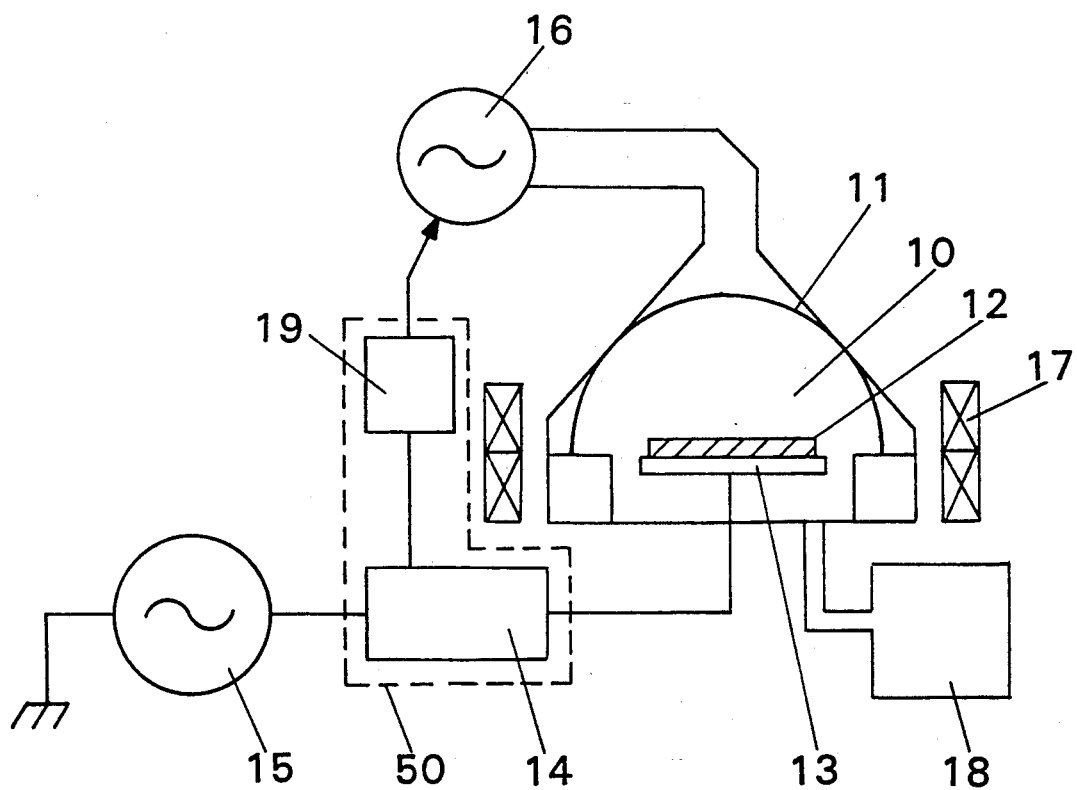
FIG. 1 is a schematic diagram showing a plasma processing apparatus of this invention.

FIG. 1 shows a plasma processing apparatus embodying the invention as applied to ECR plasma etching. In this figure, reference numeral 10 designates a plasma reaction chamber; 11 designates a quartz bell jar; 12 designates a sample to be etched; and 13 designates a sample stand. An RF bias (13.56 MHz) is supplied from an RF supply 15 to the sample stand 13 through an impedance matching circuit 14. Microwave power is supplied from a magnetron 16 to the plasma reaction chamber 10. The electron cyclotron resonance conditions are satisfied by the microwave power and the strength of a magnetic field produced by an electromagnet 17. The plasma reaction chamber 10 is evacuated by an exhaust system 18 including a vacuum pump, being controlled to a vacuum of the order of $10^1$ to $10^{-1}$ Pa.

The plasma processing apparatus in this example is mainly different from conventional ECR plasma etching apparatus in that it has a feedback mechanism 50 containing a feedback parameter setting circuit 19 connected to the impedance matching circuit 14. The impedance matching circuit 14 is also contained in the feedback mechanism 50. The feedback parameter setting circuit 19 sets a feedback parameter value on the basis of information concerning the plasma impedance within the plasma reaction chamber 10, the information being obtained from the impedance matching circuit 14 which functions as impedance sensing means, and then feeds back the parameter value to the magnetron 16 to control the microwave output thereof, thereby maintaining the plasma impedance substantially constant.

Figure 2A:
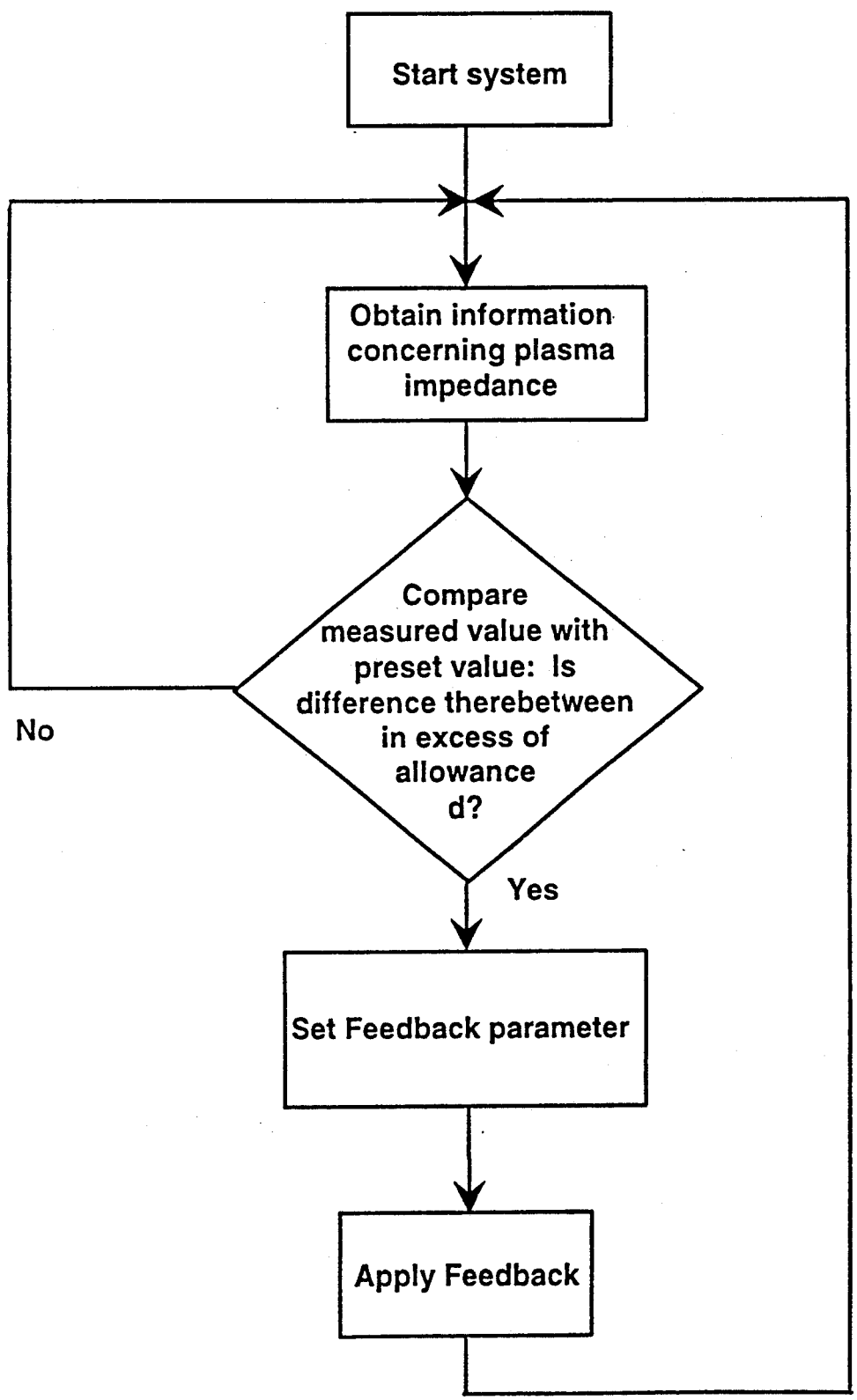
FIGS. 2A and 2B are flow charts showing different two procedures of a plasma processing method of this invention.

The basic principle of the present invention will hereinafter be explained with reference to FIG. 1 and the flow chart shown in FIG. 2A.

When the system of the plasma processing apparatus is operated, plasma impedance measurement is first carried out by the impedance sensing means 14. The measured value is then compared with a value preset by the feedback parameter setting circuit 19. In this case, only when the difference between the two values exceeds a predetermined allowance d, a feedback amount is computed in the feedback parameter setting circuit 19 and the same is fed back in response to the change in the specified feedback parameter (which is microwave power in this example, but generally includes the rate of gas flow into the plasma reaction chamber, gas pressure in the plasma reaction chamber, magnetic field, and RF power). In this way, fluctuations in plasma impedance are inhibited, with the result that the plasma condition is maintained substantially constant.

Figure 2B:
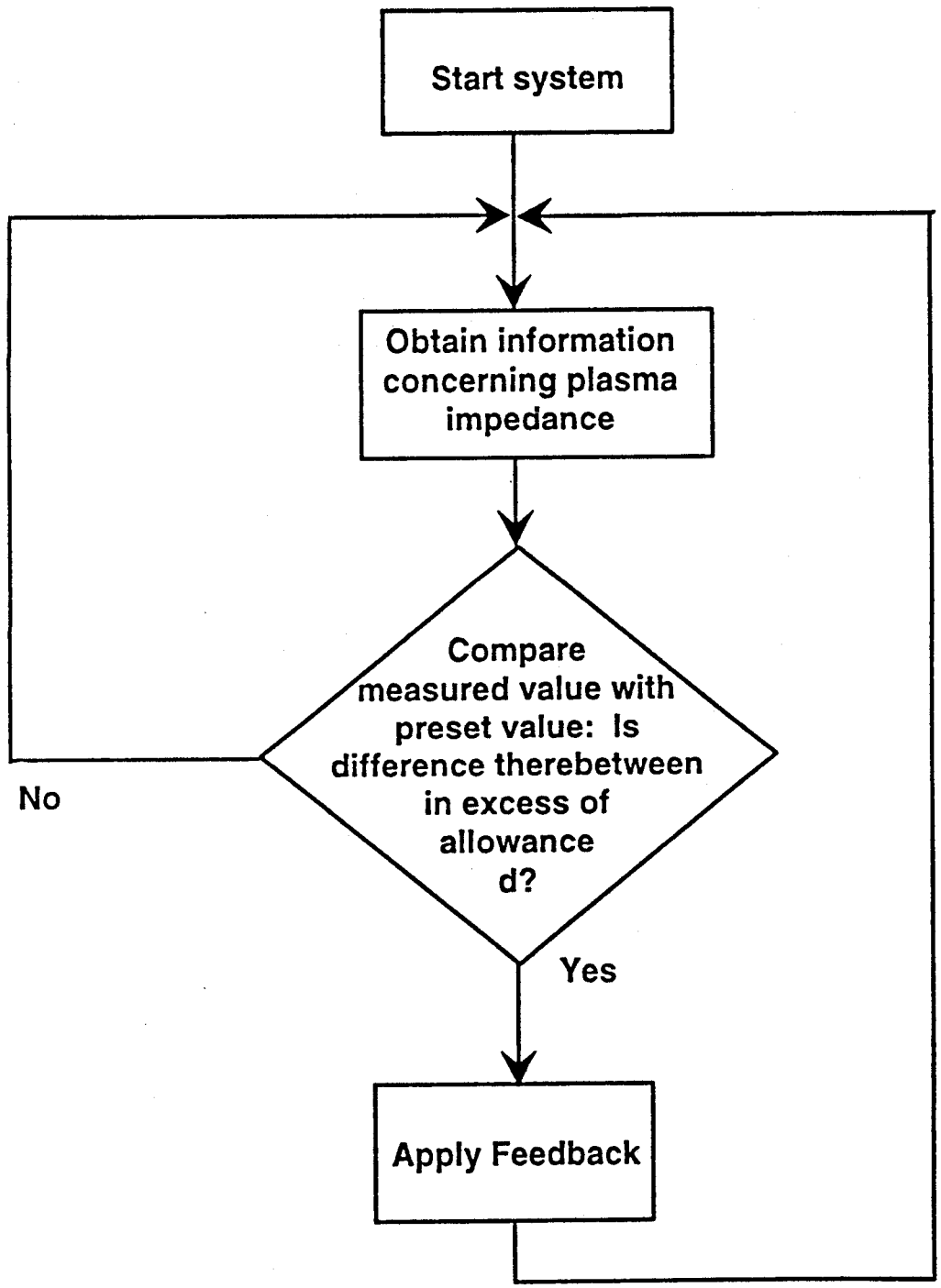

In this example, a computing circuit for feedback amount calculation is incorporated in the feedback parameter setting circuit 19. Alternatively, as shown in FIG. 2B, it may be arranged that upon detection of the fact that the difference between the measured value and the preset value is in excess of the allowance d, a feedback of a specified amount or an amount proportional to the difference is directly applied by the feedback mechanism.

Figure 3A:
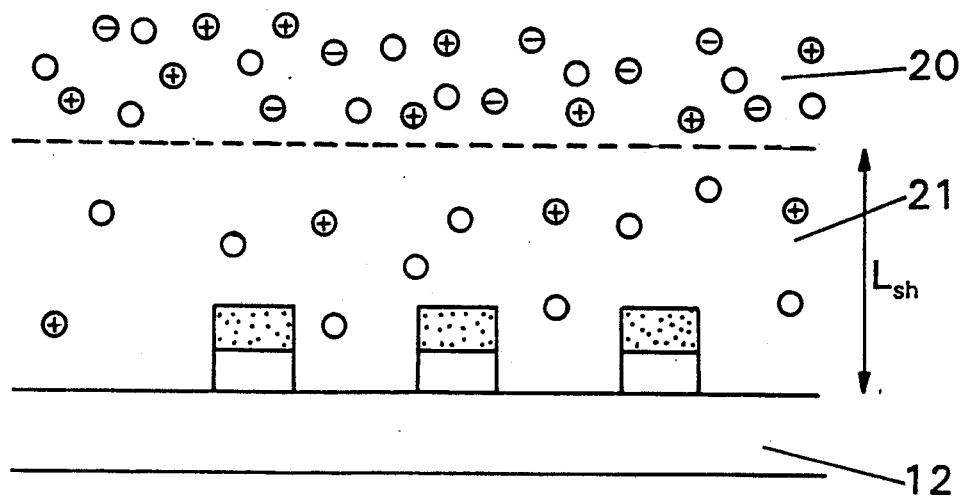
FIG. 3A is a schematic diagram showing the condition of plasma utilized in dry etching.

Next, the process of plasma impedance measurement will hereinafter be briefly explained. The plasma used in dry etching is composed of a bulk plasma 20 in which electrons, ions, and neutral molecules are contained, and an ion sheath 21 formed adjacent the surface of the sample 12 in which almost no electron is present, as shown in FIG. 3A. Positive ions impinge upon the sample 12 as they are accelerated by a potential applied to the ion sheath 21, with the result that an etching reaction occurs. It can be appreciated from this fact that the ion sheath 21 performs an important part in the process of etching.

Figure 3B:
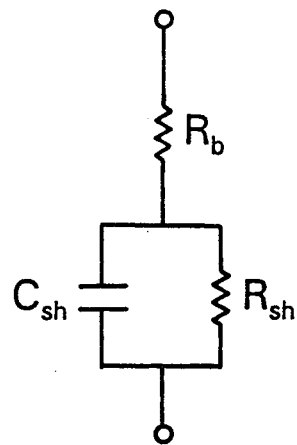
FIG. 3B is an equivalent circuit diagram of the plasma of FIG. 3A.

The plasma in FIG. 3A may be expressed by an equivalent circuit as shown in FIG. 3B. For expressions concerning plasma equivalent circuits, reference should be made to, for example, J. Ignacio Ulacia F. et al., Materials Research Society Symposia Proceedings, Vol. 98, pp. 203-208 (1987).

The bulk plasma 20 is represented by resistance $R_b$, which is connected in series to the ion sheath 21 which is represented by sheath capacity $C_{sh}$ and resistance $R_{sh}$. The plasma impedance is reflected in the ion sheath capacity $C_{sh}$ and is generally capacitive. When a change occurs in the plasma density or the like, the thickness $L_{sh}$ of the ion sheath 21 varies, which is detected as a change in the plasma impedance.

In the plasma processing apparatus of this example, plasma impedance measurement is carried out by the impedance matching circuit 14. Impedance matching is carried out in the impedance matching circuit 14 so that a maximum amount of power is supplied from the RF supply 15. In this case, the impedance with which plasma is seen from the output end of the impedance matching circuit 14 is in complex conjugate relation to the impedance with which the impedance matching circuit 14 is seen from the plasma side. This relationship is utilized in the plasma impedance measurement.

Figure 3C:
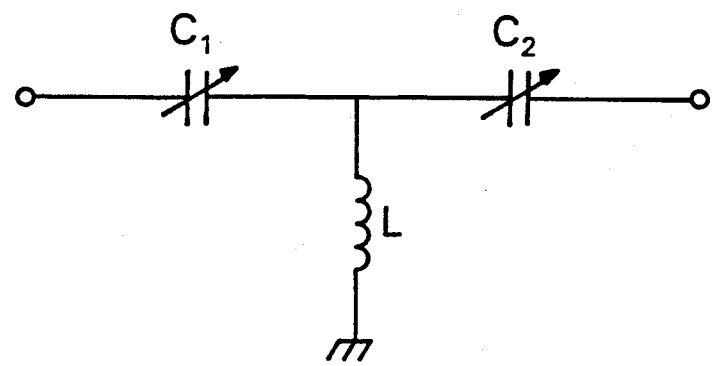
FIG. 3C is a circuit diagram of an impedance matching circuit.

For example, where the impedance matching circuit 14, as shown in FIG. 3C, comprises two variable capacitors having capacities $C_1$ and $C_2$ respectively, and a coil of inductance L, impedance values as seen from the plasma side are previously measured, and tabulated, with respect to varying $C_1$ and $C_2$ values, whereby it is possible to know plasma impedance values from the $C_1$ and $C_2$ values.

Figure 4:
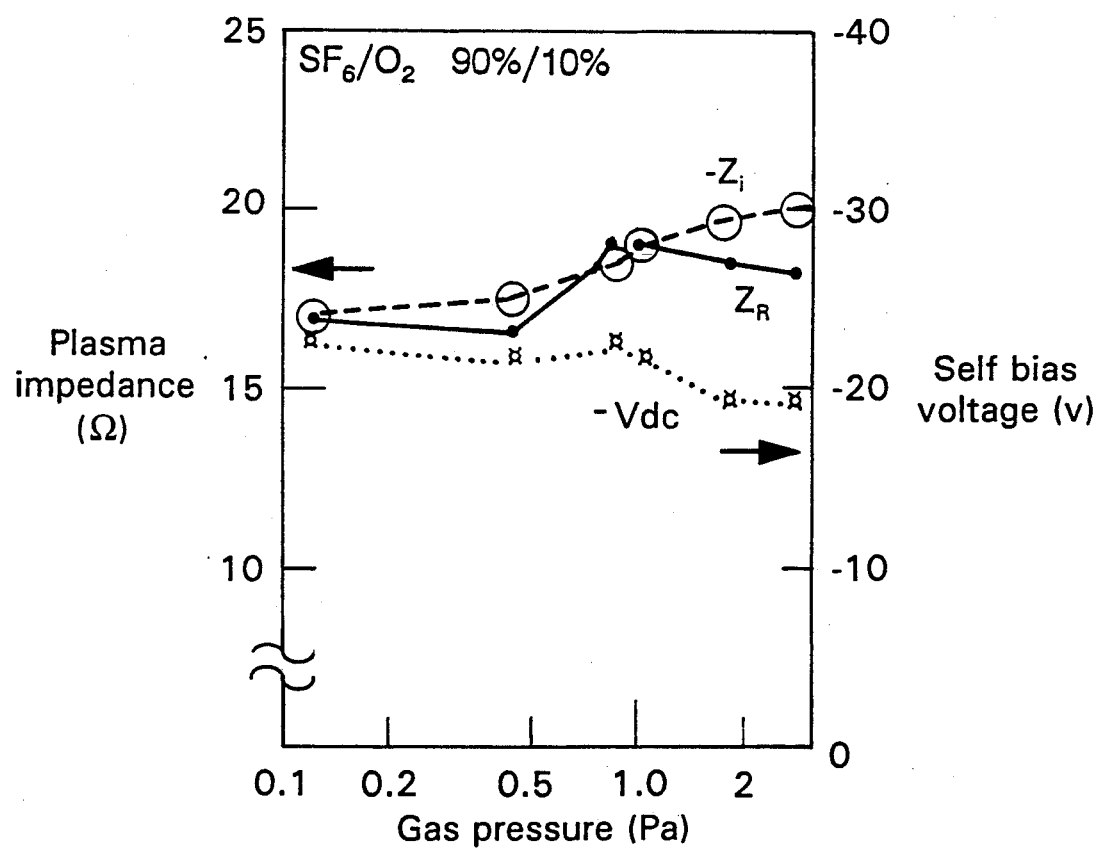
FIG. 4 is of characteristic curves showing the results of plasma impedance measurements.

FIG. 4 shows the dependency upon gas pressure of plasma impedance values measured according to the above-mentioned method, in the case where a mixture gas of $SF_6$ (90%) and $O_2$ (10%) is used. It can be seen from this figure that the electron and ion densities and electron temperature in the plasma vary in response to the variation of gas pressure, and the plasma impedance varies accordingly.

In this way, it is possible to know real-time plasma impedance values from capacity $C_1$ and $C_2$ values. Information based on the capacity $C_1$ and $C_2$ values is fed back to the microwave output of the magnetron 16 through the computing circuit of the feedback parameter setting circuit 19, whereby the plasma impedance can be maintained constant. In general, two values (i.e., real component and imaginary component) corresponding to complex-impedance variations are obtained from the capacity $C_1$ and $C_2$ values and, therefore, correction is required of the two values. In some cases, however, correction of one of the values may be sufficient for the purpose.

Figure 5A:
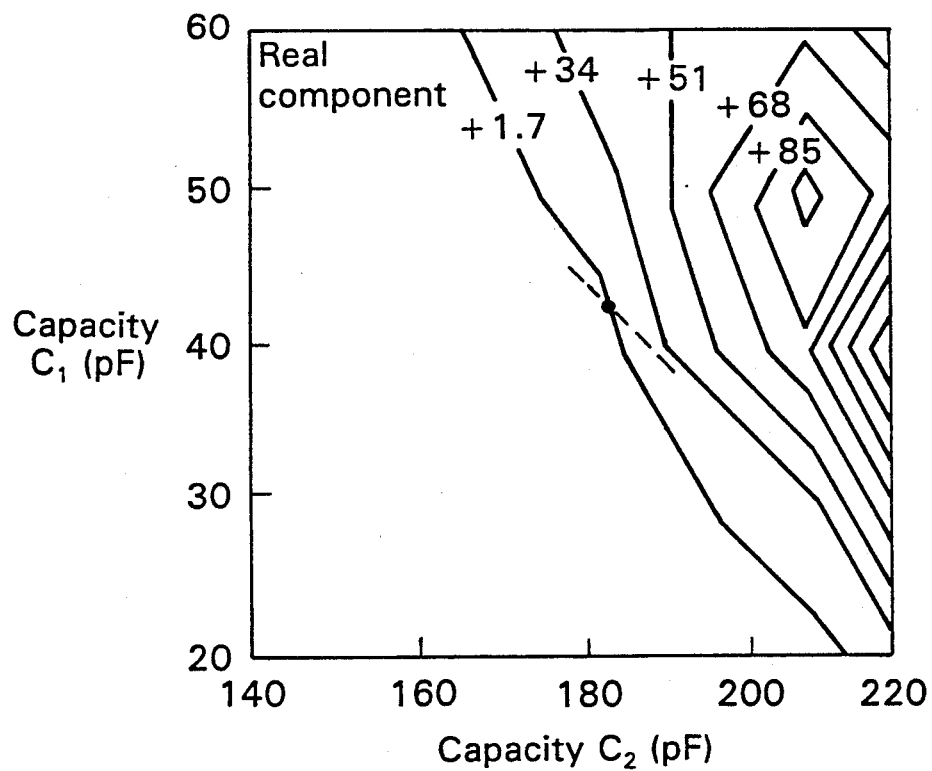
FIGS. 5A and 5B are graphs showing the relationships between the capacity $C_1$ and $C_2$ values as matched in the impedance matching circuit of FIG. 3C and the real component and imaginary component of the plasma impedance measured, respectively.
Figure 5B:
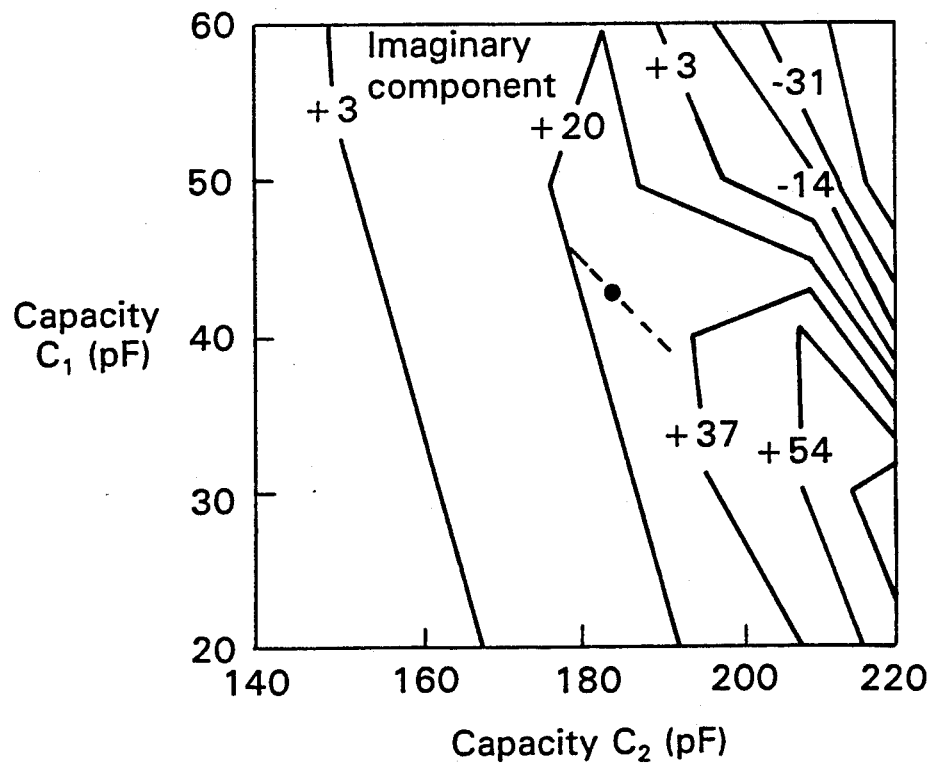

Next, this point will hereinafter be explained with reference to FIGS. 5A and 5B. FIGS. 5A and 5B are graphs showing the relationships between the capacity $C_1$ and $C_2$ values as matched in the impedance matching circuit and the real component (FIG. 5A) and imaginary component (FIG. 5B). These graphs were obtained from discrete values and have not been subjected to smoothing.

Now, assuming that the impedance set values at the initial stage of system operation were 42 pF and 183 pF (shown in black dots) in terms of capacity $C_1$ and $C_2$ values, respectively, and that plasma impedance values have varied as shown by dashed lines. As processing progresses, if, for example, the amount of microwave absorption increases as a result of film deposition on the quartz bell jar, and the plasma density decreases, then plasma impedance values also vary generally along the dashed lines. Therefore, the plasma condition can be kept generally constant by varying the microwave power so as to enable the plasma impedance to return to the initial set value level. In this case, if one of the real and imaginary components of the plasma impedance is returned to its initial value, the other will also substantially return to its initial value.

In general, for complete reproduction of the plasma condition, it is necessary that both the real component and the imaginary component of the impedance be returned to their initial set values. Where the plasma condition can be maintained substantially constant by returning one of the real and imaginary components to its initial set value as in the above mentioned case, it is desirable to effect correction by using the imaginary component, because the imaginary component is considered as reflecting the characteristics of the ion sheath which has close relations with plasma reactions.

For the purpose of achieving improved plasma condition repeatability, it is not always necessary to compute plasma impedance values. Any physical values corresponding to plasma impedance values may be suitably used for the purpose. For example, values of capacity $C_1$ and $C_2$ of the variable capacitors in the impedance matching circuit may be effectively used.

In this example, plasma condition control was actually effected in such manner with the result that etching operations could be carried out with a very high degree of repeatability.

Figure 6:
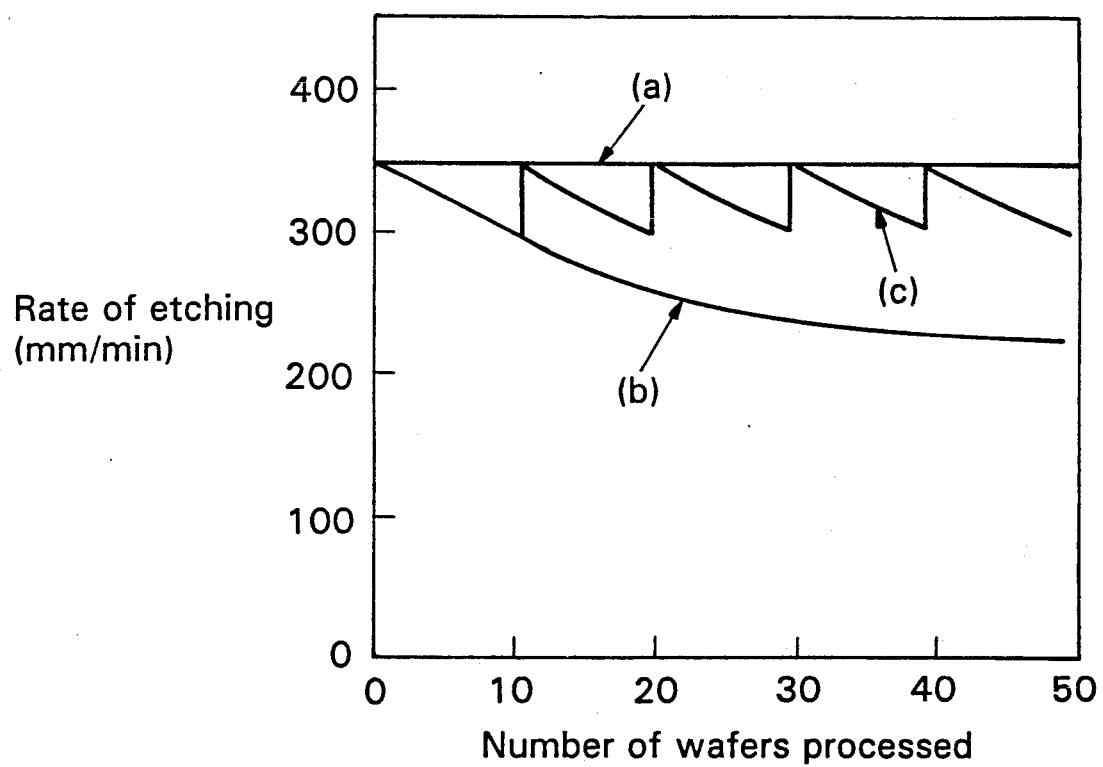
FIG. 6 is a graph showing the relationships between the number of wafers processed and the rate of etching in cases where the plasma processing apparatus of FIG. 1 and a conventional etching apparatus are used in reactive ion etching.

FIG. 6 is a graph showing the relationship between the number of wafers processed and the rate of etching in the case where reactive ion etching operations were carried out using both $C_2Cl_2F_4$ gas and $SF_6$ gas. It was usual with conventional etching apparatuses that with the increase in the number of processed units deposited films on the inner wall of the quartz bell jar and they in turn absorbed microwave, which resulted in changes in plasma density.

Where any conventional etching apparatus was employed, as indicated by curve (b) of FIG. 6, with the increase in number of processed units, the rate of etching decreased. For example, when twenty five wafers were processed, the etching rate often decreased to a level proximate to 70% of the initial etching rate. As such, in actual production lines, it was necessary to carry out chamber cleaning each time ten wafers were etched, as indicated by curve (c) of FIG. 6. In contrast, in this example, the rate of etching was only slightly dependent on the number of wafers etched, as can be clearly seen from curve (a) of FIG. 6. This manifests that by employing the plasma processing apparatus of this example, plasma density and other parameters were maintained substantially constant without their being dependent upon deposited films of the inner wall of the quartz bell jar, with the result that very stable etching characteristics were attained.

In this example, the case of correcting plasma impedance variations by microwave output was exemplified. Where feedback was applied to, for example, the RF power supply, vacuum pump system, and electromagnet, similar results were obtained.

EXAMPLE 2

Figure 7:
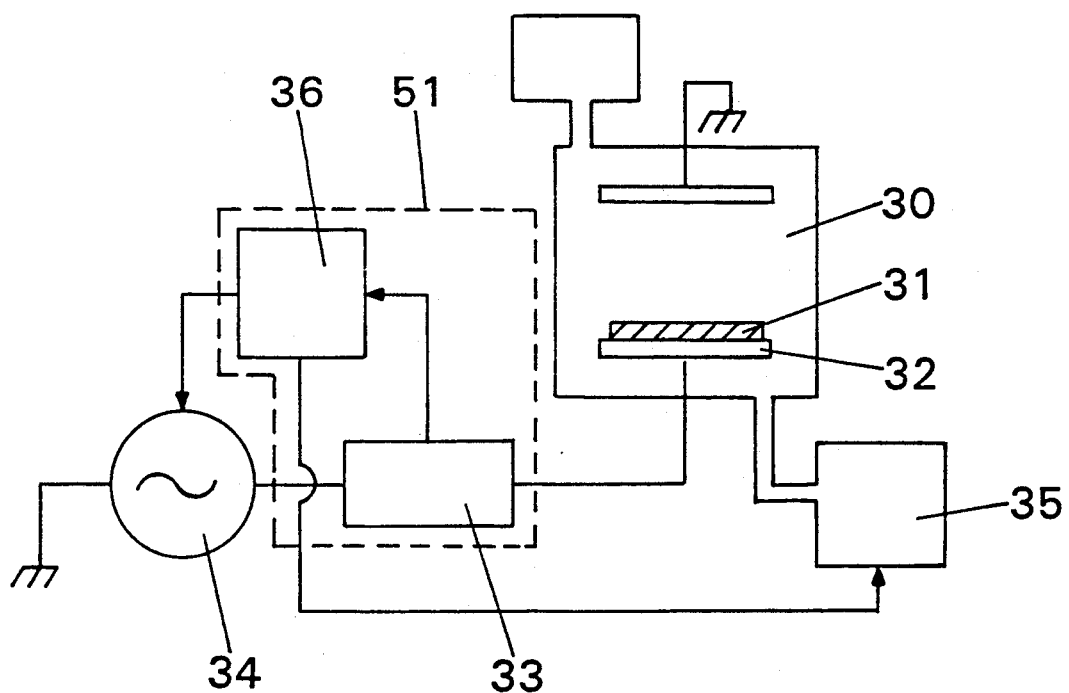
FIG. 7 is a schematic diagram showing another plasma processing apparatus of this invention.
Figure 8:
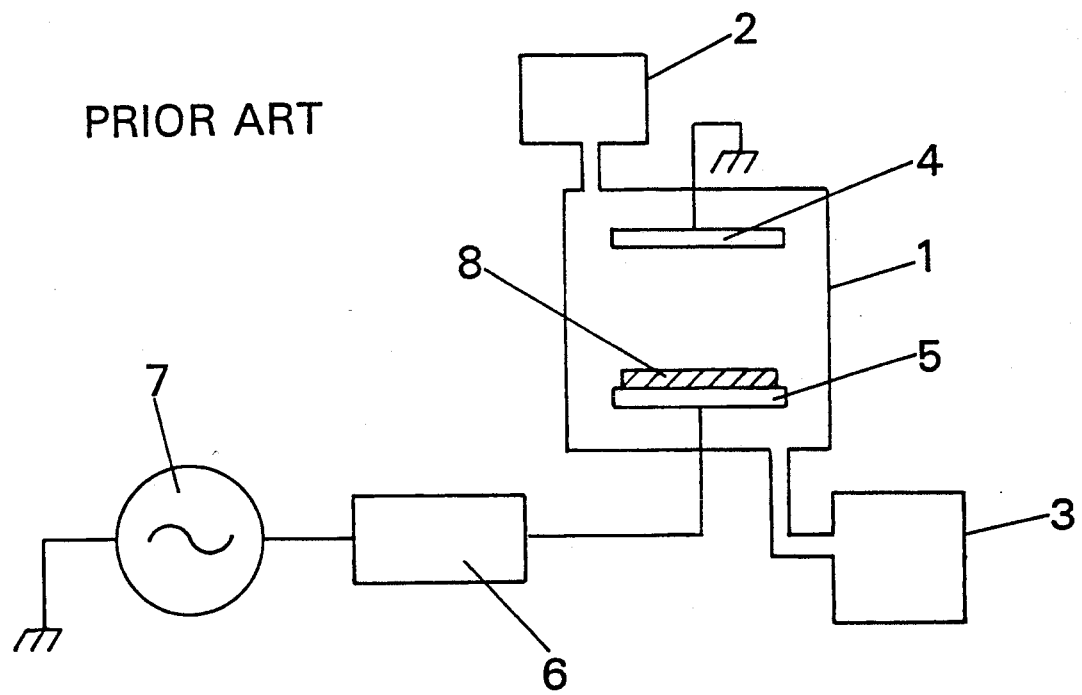
FIG. 8 is a schematic diagram showing a conventional reactive ion etching apparatus.

FIG. 7 shows a plasma processing apparatus embodying the invention as applied to RIE (reactive ion etching). In this figure, reference numeral 30 designates a plasma reaction chamber; 31 designates a sample to be etched; and 32 designates a sample stand. RF bias (13.56 MHz) is supplied from an RF power supply 34 to the sample stand 32 through an impedance matching circuit 33. The plasma reaction chamber 30 is evacuated by an exhaust system 35 including a vacuum pump and is controlled to a vacuum of the order of $10^1$ to $10^2$ Pa.

The plasma processing apparatus of this example is mainly different from conventional RIE apparatus in that it has a feedback mechanism 51 containing a feedback parameter setting circuit 36 connected to the impedance matching circuit 33. The impedance matching circuit 33 is also contained in the feedback mechanism 51. The feedback parameter setting circuit 36 sets feedback parameter values on the basis of information concerning the plasma impedance within the plasma reaction chamber 30, the information being obtained from the impedance matching circuit 33 which functions as impedance sensing means, and then apply feedback to the RF power supply 34 or exhaust system 35 to control the RF output or the degree of vacuum, thereby maintaining the plasma impedance substantially constant.

In this example, the plasma condition was actually controlled in the above noted manner and, as a result, etching operations could be performed with very high repeatability.

Where a conventional etching apparatus was employed, with the increase in number of wafers processed, gases were emitted from the deposited films on the inner wall of the reaction chamber, resulting in changes in the plasma condition. Therefore, fluctuations were seen in etching characteristics.

In contrast, in this example, there was little dependency, if any, of etching characteristics upon the number of etchings. This manifests that by employing the plasma processing apparatus of this example, plasma density and other variables were maintained substantially constant without their being dependent upon the deposited films on the inner wall of the plasma reaction chamber, very stable etching characteristics being thus obtained.

With respect to the foregoing Examples 1 and 2, description was limited to the case of dry etching, but it is to be understood that the invention is applicable to film deposition techniques, such as chemical vapor deposition (CVD), insofar as processing techniques using plasma are concerned.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A plasma processing apparatus comprising a plasma reaction chamber in which plasma is generated for processing, an RF power supply for feeding RF power into the plasma reaction chamber through an impedance matching circuit by which a maximum amount of RF power is supplied to the plasma within the plasma reaction chamber, and a feedback mechanism for setting feedback parameter values to enable the plasma impedance to return to an initial value when a change occurs in the plasma impedance, the feedback mechanism containing the impedance matching circuit which also functions as impedance sensing means.

2. A plasma processing apparatus according to claim 1, wherein said apparatus has the feedback mechanism for setting feedback parameter values to enable the imaginary component of the plasma impedance to return to an initial value when a change occurs in the plasma impedance.

3. A plasma processing apparatus according to claim 1, wherein the feedback mechanism contains a feedback parameter setting circuit connected to the impedance matching circuit, at least one feedback parameter value being set in the feedback parameter setting circuit on the basis of information concerning the plasma impedance.

4. A plasma processing apparatus according to claim 3, wherein said at least one feedback parameter is selected from the group consisting of gas pressure in the plasma reaction chamber, rate of gas flow into the plasma reaction chamber, magnetic field, microwave power, and RF power.

5. A plasma processing apparatus according to claim 3, wherein the information concerning the plasma impedance is at least one capacity value of capacitors used in the impedance matching circuit.

6. A plasma processing apparatus according to claim 1, wherein the feedback mechanism directly applies feedback on the basis of information concerning the plasma impedance.

7. A plasma processing apparatus according to claim 6, wherein the feedback is applied to at least one selected from the group consisting of gas pressure in the plasma reaction chamber, rate of gas flow into the plasma reaction chamber, magnetic field, microwave power, and RF power.

8. A plasma processing apparatus according to claim 6, wherein the information concerning the plasma impedance is at least one capacity value of capacitors used in the impedance matching circuit.

9. A plasma processing method comprising the steps of providing a plasma reaction chamber in which plasma is generated for processing, an RF power supply for feeding RF power into the plasma reaction chamber through an impedance matching circuit by which a maximum amount of RF power is supplied to the plasma, and a feedback mechanism for setting feedback parameter values to enable the plasma impedance to return to an initial value when a change occurs in the plasma impedance and further comprising the steps of etching or depositing films by using plasma, while maintaining the plasma impedance substantially constant by applying feedback to at least one of the feedback parameter values selected from the group consisting of gas pressure in the plasma reaction chamber, a rate of gas flow into the plasma reaction chamber, magnetic field, microwave power, and RF power.

10. A plasma processing method according to claim 9, wherein the imaginary component of the plasma impedance is maintained substantially constant.

* * * * *